United States Patent
Ying et al.

(10) Patent No.: US 11,525,668 B2
(45) Date of Patent: *Dec. 13, 2022

(54) APPARATUS AND METHOD FOR METROLOGY

(71) Applicant: TAIWAN SEMICONDUCTOR MANUFACTURING CO., LTD., Hsinchu (TW)

(72) Inventors: Ji-Feng Ying, Hsinchu (TW); Baohua Niu, Portland, OR (US); David Hung-I Su, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 40 days.

This patent is subject to a terminal disclaimer.

(21) Appl. No.: 17/141,089

(22) Filed: Jan. 4, 2021

(65) Prior Publication Data

US 2021/0148695 A1 May 20, 2021

Related U.S. Application Data

(63) Continuation of application No. 15/908,201, filed on Feb. 28, 2018, now Pat. No. 10,883,820.
(Continued)

(51) Int. Cl.
*G01B 11/06* (2006.01)
*G03F 7/20* (2006.01)
(Continued)

(52) U.S. Cl.
CPC .......... *G01B 11/06* (2013.01); *G01B 11/0616* (2013.01); *G01N 21/8422* (2013.01);
(Continued)

(58) Field of Classification Search
CPC ............... G01N 21/65; G01N 21/6428; G01N 21/6458; G01N 21/648; G01N 21/47;
(Continued)

(56) References Cited

U.S. PATENT DOCUMENTS

| | | |
|---|---|---|
| 5,304,795 A | 4/1994 | Fujihira et al. |
| 5,894,122 A | 4/1999 | Tomita |

(Continued)

FOREIGN PATENT DOCUMENTS

| | | |
|---|---|---|
| JP | 2000-306235 A | 11/2000 |
| TW | 201447271 A | 12/2014 |

OTHER PUBLICATIONS

R. Wannemacher et al., "Resonant absorption and scattering in evanescent fields", Applied Physics B, vol. 68, 1999, pp. 225-232.
(Continued)

*Primary Examiner* — Hoa Q Pham
(74) *Attorney, Agent, or Firm* — McDermott Will & Emery LLP

(57) ABSTRACT

A method of performing metrology analysis of a thin film includes coupling a radiation into an optical element disposed adjacent to a surface of the thin film. The radiation is coupled such that the radiation is totally internally reflected at an interface between the optical element and the thin film. An evanescent radiation generated at the interface penetrates the thin film. The method furthers include analyzing the evanescent radiation scattered by the thin film to obtain properties of the thin film.

20 Claims, 8 Drawing Sheets

Related U.S. Application Data

(60) Provisional application No. 62/585,207, filed on Nov. 13, 2017.

(51) Int. Cl.
  *G01N 21/84* (2006.01)
  *G01N 21/95* (2006.01)
  *G01N 21/956* (2006.01)
  *H01L 21/66* (2006.01)

(52) U.S. Cl.
  CPC ....... *G01N 21/9501* (2013.01); *G01N 21/956* (2013.01); *G03F 7/2043* (2013.01); *G03F 7/70633* (2013.01); *H01L 22/12* (2013.01)

(58) Field of Classification Search
  CPC .. G01N 21/6456; G01J 3/2823; G01J 3/2889; G01J 3/4406; G02B 21/16
  USPC .................. 356/445, 417, 300, 301, 318
  See application file for complete search history.

(56) References Cited

U.S. PATENT DOCUMENTS

| | | | |
|---|---|---|---|
| 6,255,642 B1 | 7/2001 | Cragg et al. | |
| 6,934,024 B2 | 8/2005 | Zhan et al. | |
| 7,136,161 B2 | 11/2006 | Nakamura | |
| 7,397,559 B1 | 7/2008 | Bratkovski | |
| 8,796,666 B1 | 8/2014 | Huang et al. | |
| 9,093,530 B2 | 7/2015 | Huang et al. | |
| 9,134,633 B2 | 9/2015 | Lin et al. | |
| 9,230,867 B2 | 1/2016 | Cheng et al. | |
| 9,304,403 B2 | 4/2016 | Lin et al. | |
| 9,404,743 B2 | 8/2016 | Chiu et al. | |
| 9,548,303 B2 | 1/2017 | Lee et al. | |
| 9,823,585 B2 | 11/2017 | Shih et al. | |
| 9,841,687 B2 | 12/2017 | Lee et al. | |
| 9,859,139 B2 | 1/2018 | Cheng et al. | |
| 10,883,820 B2* | 1/2021 | Niu | G01N 21/9501 |
| 2003/0016614 A1 | 1/2003 | Vo-Dinh | |
| 2003/0227623 A1 | 12/2003 | Zhan et al. | |
| 2004/0184960 A1 | 9/2004 | Tanaami | |
| 2005/0141843 A1 | 6/2005 | Warden et al. | |
| 2006/0171032 A1 | 8/2006 | Nishioka | |
| 2012/0018651 A1 | 1/2012 | Hess et al. | |
| 2012/0097864 A1 | 4/2012 | Takahashi et al. | |
| 2012/0126142 A1 | 5/2012 | Matsui et al. | |
| 2013/0003515 A1 | 1/2013 | Knappmann et al. | |
| 2015/0377795 A1 | 12/2015 | Zhao et al. | |
| 2017/0153436 A1 | 6/2017 | Park et al. | |

OTHER PUBLICATIONS

R. Wannemacher et al., "Evanescent-wave scattering in near-field optical microscopy", Journal of Microscopy, vol. 194, Pt 2/3, May/Jun. 1999, pp. 260-264.
J. Le Perchec et al., "Why Metallic Surfaces with Grooves a Few Nanometers Deep and Wide May Strongly Absorb Visible Light", Physical Review Letters, PRL 100, 2008, pp. 066408-1-066408-4.
Daniel Axelrod et al., "Total Internal Reflection Fluorescence", Annual Review Biophys. Bioeng., vol. 13, 1984, pp. 247-268.
Robert C. Dunn, "Near-Field Scanning Optical Microscopy", Chemical Reviews, vol. 99, No. 10, 1999, pp. 2892-2997.
Non-Final Office Action issued in related U.S. Appl. No. 15/908,201, dated May 9, 2019.
Final Office Action issued in related U.S. Appl. No. 15/908,201, dated Sep. 25, 2019.
Non-Final Office Action issued in related U.S. Appl. No. 15/908,201, dated Mar. 10, 2020.
Notice of Allowance issued in related U.S. Appl. No. 15/908,201, dated Jul. 24, 2020.

* cited by examiner

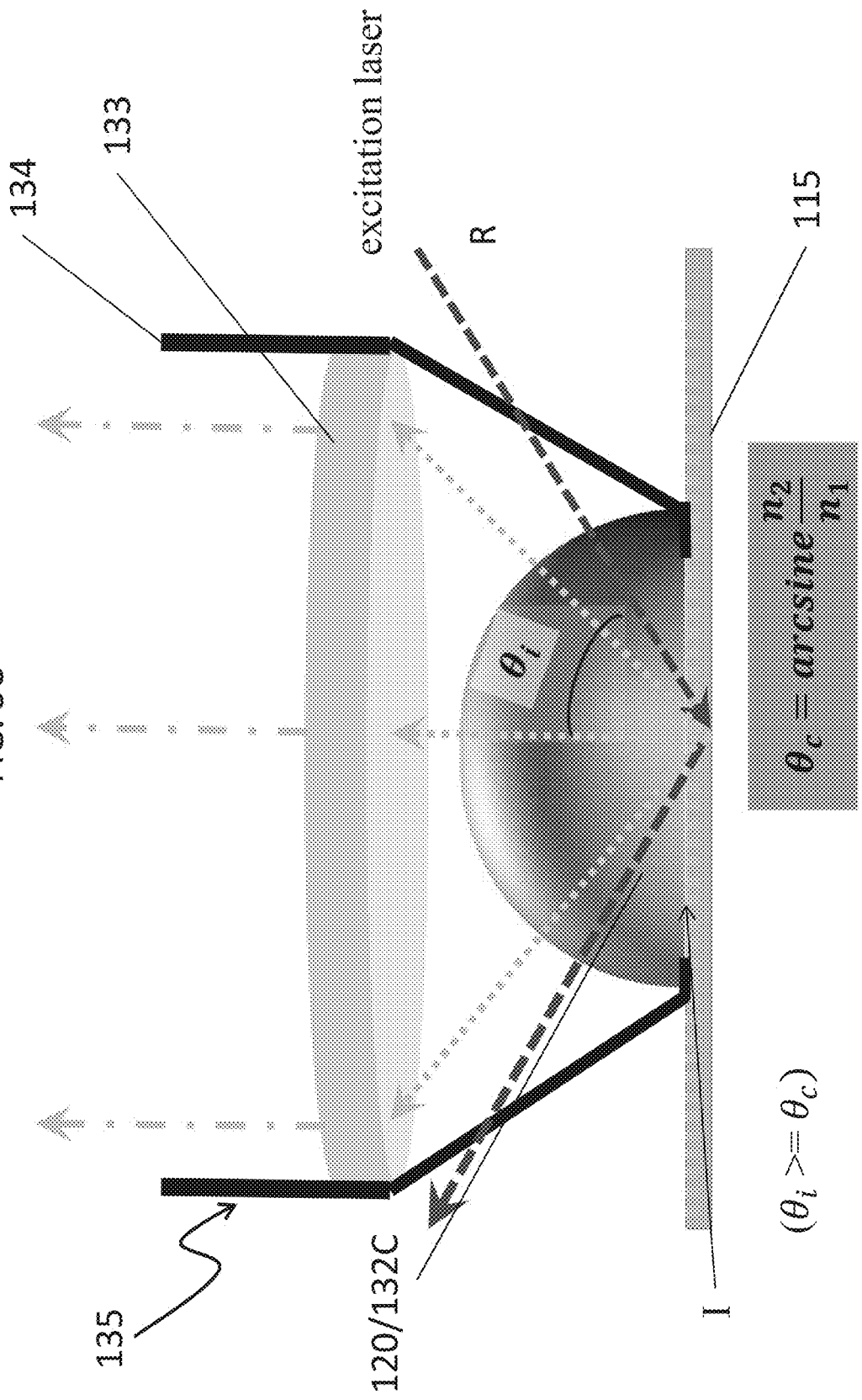

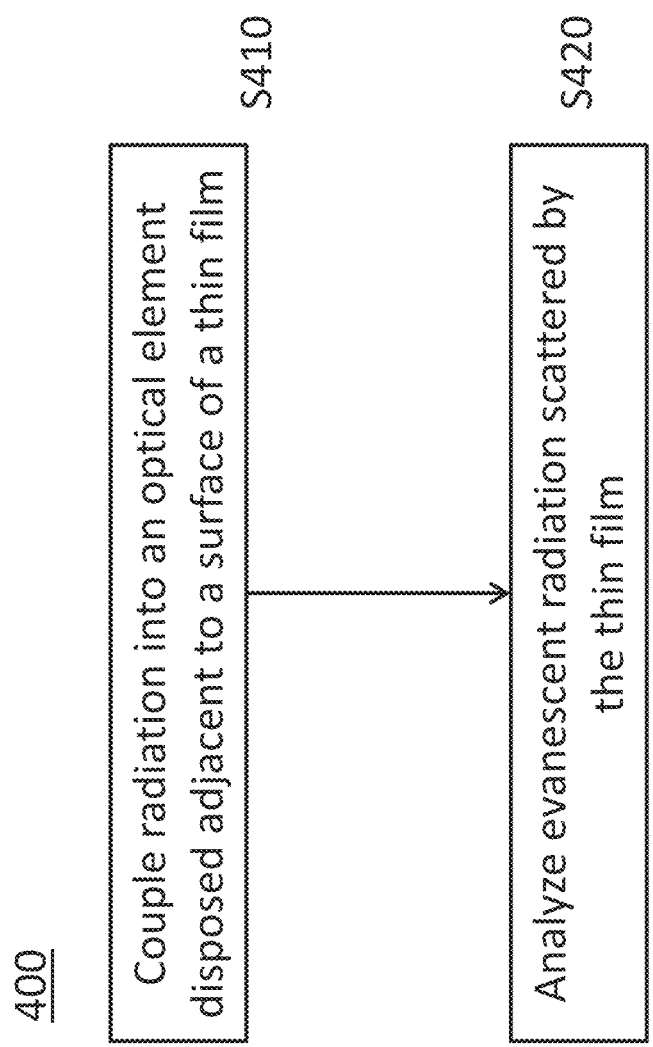

APPARATUS AND METHOD FOR METROLOGY

RELATED APPLICATIONS

This application is a continuation application of U.S. patent application Ser. No. 15/908,201 filed Feb. 28, 2018, now U.S. Pat. No. 10,883,820, which claims priority to U.S. provisional application No. 62/585,207, filed Nov. 13, 2017, the entire contents of which are incorporated herein by reference.

TECHNICAL FIELD

The disclosure relates to methods for analyzing properties of thin films, and an apparatus for analyzing properties of thin films.

BACKGROUND

Semiconductor fabrication processes routinely include deposition of thin films having a thickness between 1 nm and 100 nm. Usually, such thin films have patterns defined either by a lithography process or through selective growth. In some instances, a thin film is patterned and in other instances, a thin film is formed over an underlying patterned structure. Such patterned thin films include defects or impurities, introduced intentionally (e.g., through doping) or unintentionally.

Depending on the function of the integrated circuit being manufactured, a given wafer may have as many as 30 patterned thin films deposited or formed at various stages of the fabrication process. Accurate and non-destructive characterization of physical and/or chemical properties of individual patterned thin films at each stage of fabrication is needed to ensure that the device being fabricated functions as designed and the fabrication process is efficient and reliable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3C schematically depicts an apparatus for metrology analysis of a thin film, in accordance with yet another embodiment of the present disclosure.

FIG. 5 depicts a flow chart of a method 400 of performing metrology analysis of a thin film, in accordance with an embodiment of the present disclosure.

DETAILED DESCRIPTION

Figure 1:
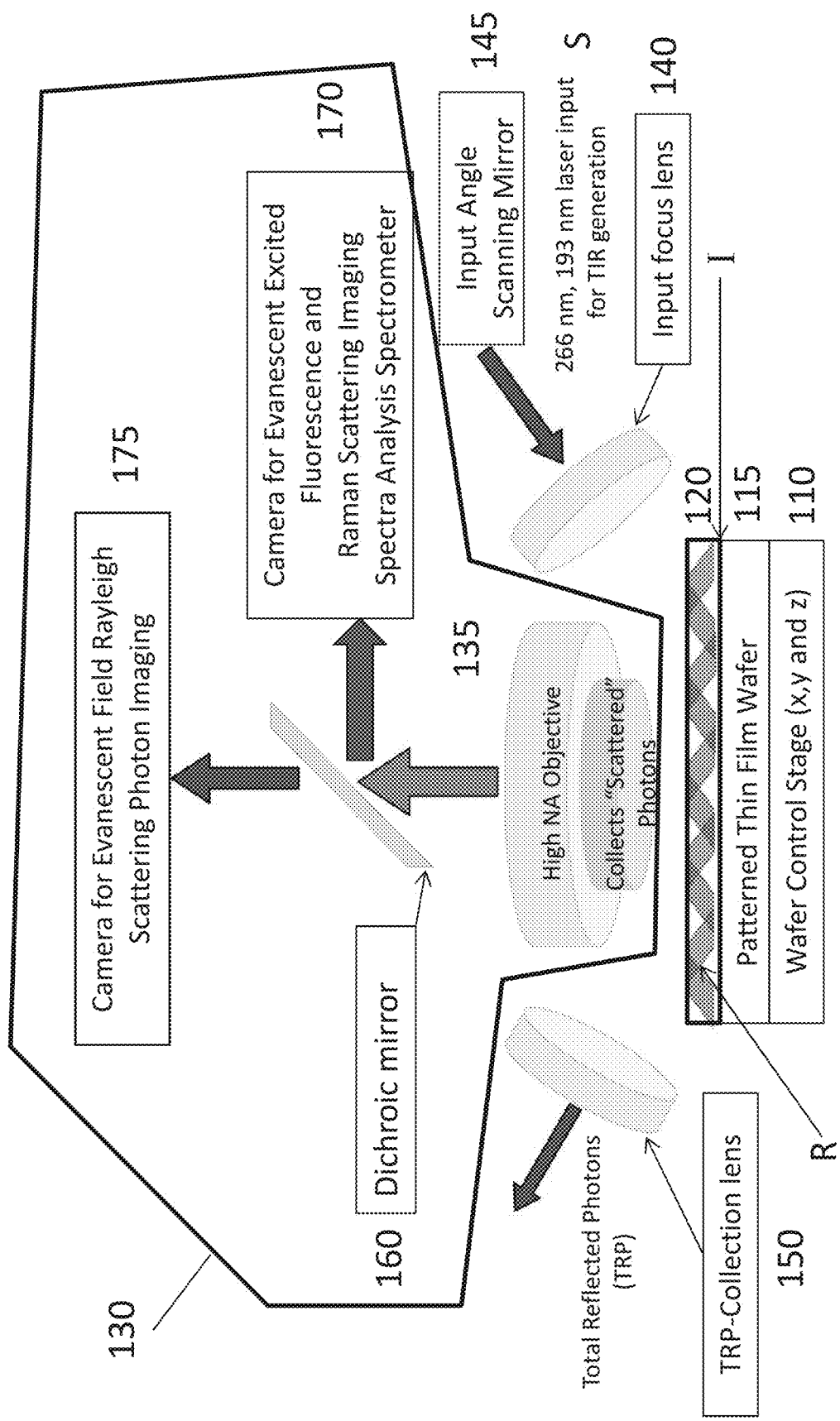
FIG. 1 schematically illustrates an apparatus for performing metrology analysis on a thin film, in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of."

The present disclosure generally relates to methods and apparatuses for analyzing thin films, and in particular, analyzing patterned thin films. The methods and apparatuses described herein facilitate measurement of geometric, physical and/or chemical characteristics of patterned thin films. As feature size decreases, optical measurements (even using extreme ultraviolet) may not have sufficient resolution to properly provide geometric information about patterned thin films because of diffraction limits. While scanning electron microscopy (SEM) can provide sub-nanometer resolution, the measurements in SEM have to be performed offline (i.e., by removing the wafer on which the patterned thin film is formed to another platform), increasing measurement time and reducing process efficiency. Currently available techniques for measuring other physical and chemical properties (e.g., crystal defects or doping concentrations) of patterned thin films include secondary ion mass spectroscopy (SIMS) or low energy ion scattering (LEIS) involve destruction of the patterned thin films and only provide localized information. Embodiments of the apparatuses and methods described herein are expected to facilitate non-destructive and inline analysis of geometric, physical and chemical characteristics of the patterned thin films over relatively large areas, thereby increasing the yield and efficiency of semiconductor fabrication processes.

In some embodiments, the term "patterned thin film" refers to a film having a thickness in a range from about 0.5 nm to about 10 μm and having a geometric pattern. In some instances, the geometric pattern of a patterned thin film is formed using lithography techniques, e.g., by selectively etching portions of the film not protected by a etch mask. In some instances, the geometric pattern of a patterned thin film is formed during deposition of the film because of an underlying pattern, e.g., through epitaxial growth on a patterned base layer. In yet other instances, a portion of the geometric pattern of a patterned thin film is formed using lithography techniques, and another portion of the geometric pattern is formed during deposition.

FIG. 1 schematically illustrates an apparatus for performing metrology analysis on a thin film, in accordance with an embodiment of the present disclosure. In an embodiment, the apparatus includes an optical element 120 disposed adjacent to a surface of a thin film 115, for example above the surface of the thin film 115. The optical element 120 is configured to totally internally reflect a radiation R from a radiation source S at an interface I between the optical element 120 and the thin film 115 such that evanescent radiation generated at the interface I penetrates the thin film 115. The apparatus further includes an evanescent radiation detector 130. The evanescent radiation detector 130 is configured to detect the evanescent radiation scattered by the thin film 115 to analyze geometric, physical and/or chemical properties of the thin film 115. The portion of radiation R that passes through the thin film 115, i.e., comprising of photons that are totally internally reflected through the thin film 115, is detected by the TRP collection lens 150.

A light beam propagating through a transparent medium undergoes total internal reflection when the beam encounters an interface with another medium having a lower refractive (RI) index at an angle of incidence greater than the "critical angle." The critical angle c is given by:

$$\theta_c = \sin^{-1}(n_2/n_1) \quad \text{Equation (1),}$$

where $n_2$ is the RI of the other medium and $n_1$ is the RI of the medium in which the beam is propagating.

Figure 2:
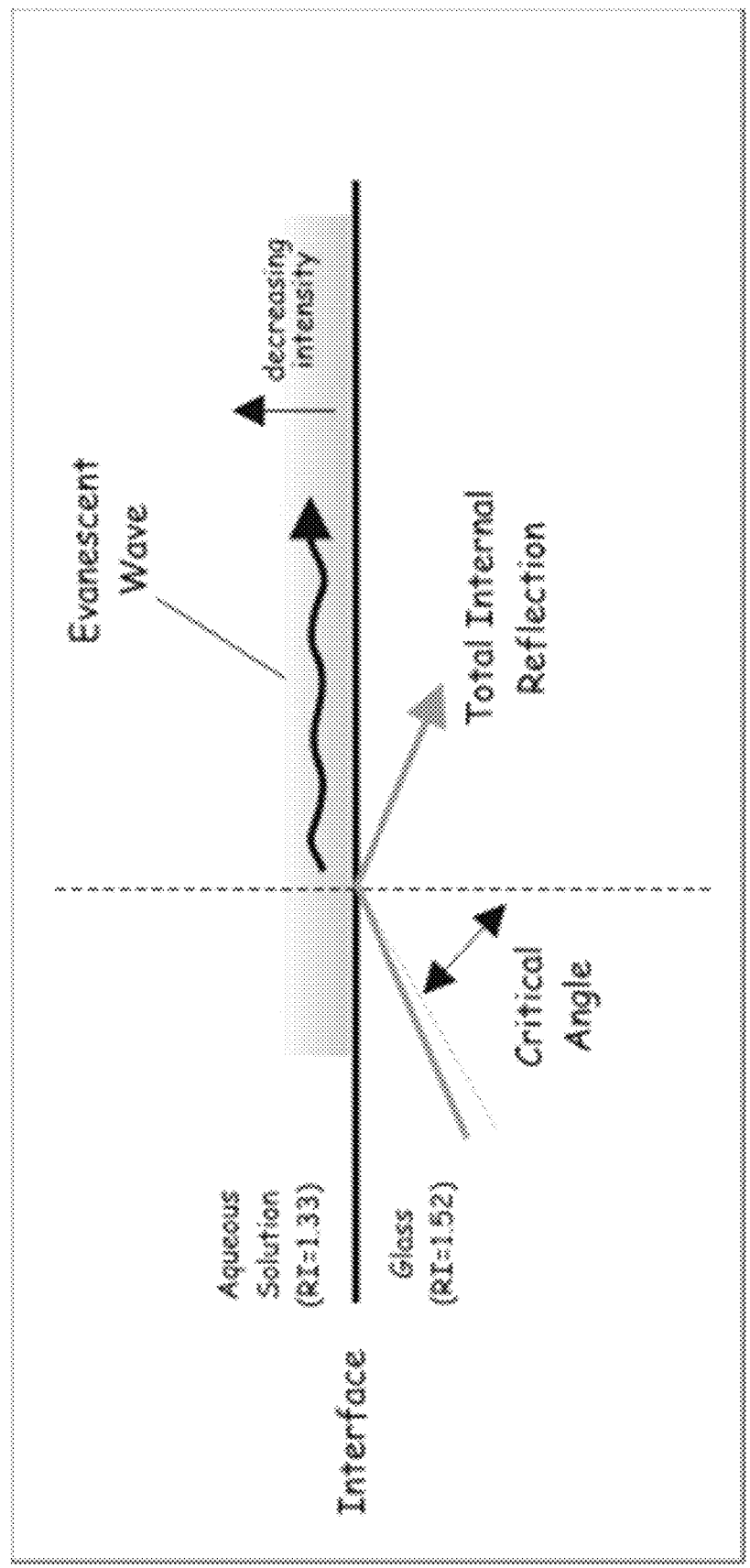
FIG. 2 schematically illustrates a light beam undergoing total internal reflection.

FIG. 2 schematically illustrates a light beam undergoing total internal reflection. A light beam propagating in water (RI=1.33) approaching an interface with air (RI=1) will undergo total internal reflection back into water if the angle of incidence at the interface is greater than $\theta_c = \sin^{-1}(1/1.33) \approx 48.6°$. In such instances, even though the light beam totally internally reflects back into water, an electromagnetic field called the "evanescent wave" (interchangeably referred to herein as "evanescent radiation") penetrates a small distance into air and propagates parallel to the interface between air and water in the plan of incidence.

The intensity, I(z), of evanescent radiation at a distance z perpendicular to the interface (i.e., x-y plane, x-z plane being the place of incidence), decays exponentially into the interface and is given by.

$$I(z) = I_o e^{-z/d}, \text{ where } d = (\lambda_o/4\pi)[n_1^2 \sin^2\theta - n_2^2]^{-1/2} \quad \text{Equation (2).}$$

$\lambda_o$ in Equation (2) is the wavelength of the light beam in vacuum. The critical evanescent depth (also referred to herein as the "skin depth"), d, in Equation (2) is on the order of $\lambda_o$.

Intensity $I_o$ at z=0 depends on angle of incidence $\theta$ as well as on incident beam polarization because $I_o$ is proportional to the square of the amplitude of the evanescent electric field at z=0. The electric field components at z=0 are given by:

$$E_x = \left[ \frac{2\cos\theta(\sin^2\theta - n^2)^{1/2}}{(n^4\cos^2\theta + \sin^2\theta - n^2)^{1/2}} \right] A_{pl} e^{-i(\delta_{pi} + \pi/2)}, \quad \text{Equation (3)}$$

$$E_y = \left[ \frac{2\cos\theta}{(1-n^2)^{1/2}} \right] A_{pr} e^{-i\delta_{pr}}, \text{ and} \quad \text{Equation (4)}$$

$$E_z = \left[ \frac{2\cos\theta\sin\theta}{(n^4\cos^2\theta + \sin^2\theta - n^2)^{1/2}} \right] A_{pl} e^{-i\delta_{pl}}, \quad \text{Equation (5)}$$

where $$\delta_{pl} \equiv \tan^{-1}\left[ \frac{(\sin^2\theta - n^2)^{1/2}}{n^2\cos\theta} \right], \text{ and} \quad \text{Equation (6)}$$

$$\delta_{pr} \equiv \tan^{-1}\left[ \frac{(\sin^2\theta - n^2)^{1/2}}{\cos\theta} \right], \quad \text{Equation (7)}$$

Subscript "pl" denotes polarization parallel to the plane of incidence and "pr" denotes polarization perpendicular to the plane of incidence. Thus, the evanescent intensities parallel and perpendicular to the plane of incidences are given by:

$$I_o^{pl} = \mathcal{I}^{pl} \frac{4\cos^2\theta(2\sin^2\theta - n^2)}{n^4\cos^2\theta + \sin^2\theta - n^2}, \text{ and} \quad \text{Equation (8)}$$

$$I_o^{pr} = \mathcal{I}^{pr} \frac{4\cos^2\theta}{1-n^2}, \quad \text{Equation (9)}$$

where $n = n_2/n_1 < 1$.

Based on the equations, it can be seen that the intensity of the evanescent wave depends on the angle of incidence (greater than critical angle $\delta_c$) and the wavelength of incident light. The evanescent intensity is not weak but can be several times stronger than incident intensity for angles of incidence within a few degrees of the critical angle $\theta_c$. Furthermore, $I_o^{pl}$ is more intense for all $\theta$. It is notable that the evanescent electric field is transverse to the propagation direction only for the pr polarization. The pl polarization electric field "cartwheels" along the surface (i.e., travels parallel to the surface with non-zero longitudinal and transverse components) with a spatial period of ($\lambda_o/(n_1 \sin\theta)$). Thus, viewed from an energy perspective, some of the energy of a finite beam width crosses the interface into the lower refractive index material (i.e., the thin film 115 in the present context), skims along the surface for an angle-dependent distance (ranging from a fraction of a wavelength at $\theta=90°$ to infinite at $\theta=\theta_c$), and then reenters the higher refractive index material (i.e., the optical element 120 in the present context). Thus, the depth, to which the energy penetrates the interface into the lower refractive index material, can be controlled by controlling the angle of incidence, particularly for short wavelength radiation such as DUV or EUV.

Materials that are typically used in semiconductor fabrication to form the thin films include silicon, silicon dioxide, silicon nitride, doped silicon, silicon germanium, germanium, etc. Thus, a suitable material of the optical element 120 has a relatively high refractive index. For example, materials like diamond, titanium dioxide, strontium titanate, sapphire, etc. are used to form the optical element 120 in some embodiments. However, not all materials with high refractive index may be suitable because of their absorption characteristics for radiation of given wavelength. For example, in an embodiment, the radiation source S is a DUV laser having a wavelength of 266 nm or 248 nm. In other embodiments, the radiation source S is a DUV laser having a wavelength of 193 nm. In yet other embodiments, the radiation source S is an EUV light source. The radiation source S, in some embodiments, is a continuous laser with an average power in the range from about 100 µW to about 1 W. In other embodiments, the radiation source S is a pulsed laser with a pulse frequency in the range from about 10 Hz to about 100 MHz and a peak power in the range of about 100 µW to about 1 W. In various embodiments, peak wavelength of the radiation source S ranges from about 150 nm to about 300 nm.

In various embodiments, the optical element 120 is made from a material that has a high refractive index and low absorption in a chosen portion of the electromagnetic spectrum (e.g., DUV or EUV) to enable geometric measurement of patterns (or features) on the thin film 115. For example, the optical element 120 made of diamond provides a skin depth d of about 15 nm using a 266 nm light for a SiGe film in an embodiment.

The size of the optical element 120 is chosen to optimize the coupling of the radiation R into the thin film 115 and coupling of the scattered evanescent radiation into the high-NA lens 135. For example, in various embodiments, the optical element 120 has a thickness in the range of about 500 µm to about 5 mm depending on the material from which the optical element 120 is made. In an embodiment, the optical element 120 is a diamond prism and has a thickness in the range of about 1 mm to about 2 mm. In various embodiments, the optical element 120 has a diameter of about 0.5 mm to about 20 mm depending on the size and specifications of the high-NA lens 135.

Referring back to FIG. 1, in an embodiment, the thin film 115 has a thickness in range from about 1 nm to about 1 µm, and is disposed on a solid wafer. In practice, a thin film having a thickness in a range from about 1 nm to about 1 µm is almost never free floating. In other words, in practice, a thin film is almost always considered along with its substrate. Thus, as described herein, unless explicitly specified or made clear by context, thin film 115 refers to the thin film and the solid wafer on which it is disposed. In an embodiment, the thin film 115 is disposed on a wafer control stage 110 configured to move the thin film 115 in x, y and z directions, as needed.

In various embodiments, the thin film 115 is formed of a suitable material disposed on a suitable wafer. Suitable material for the thin film 115 disposed on the wafer, in various embodiments, includes, without limitation, silicon dioxide, silicon nitride, polysilicon, silicon germanium, silicon oxynitride, etc., used in semiconductor manufacturing process. Suitable wafers include, but are not limited to, a silicon wafer, a germanium wafer, a silicon-on-insulator (SOI) wafer, etc. In various embodiments, the thin film 115 is formed using a suitable process such as, for example, atomic layer deposition, chemical vapor deposition, physical vapor deposition (including thermal evaporation and electron-beam assisted evaporation), etc. The thin film 115, in some embodiments, is a patterned thin film, patterned using a suitable semiconductor patterning process such as, for example, photolithography including coating the thin film 115 with a suitable photoresist, exposing the photoresist to actinic radiation through a suitable pattern mask, developing the exposed photoresist to form a patterned photoresist, extending the pattern into the thin film 115 by etching the thin film 115 using a suitable dry or wet etching technique, and removing the photoresist.

In an embodiment, the apparatus further includes an input focus lens 140 to couple the radiation R into the optical element 120 and an input angle scanning mirror 145 to change an angle at which the radiation R is coupled into the optical element 120. As discussed elsewhere herein, and seen from Equation (2), the skin depth d of evanescent radiation depends on the angle θ at which the light beam is incident at the interface between the optical element 120 and the thin film 115. By changing an angle at which the radiation R is coupled into the optical element 120, the skin depth d of evanescent radiation can be changed. Thus, depending on the wavelength of the radiation R, and the materials of the optical element 120 and the thin film 115, and the angle of coupling, sub-nanometer penetration of evanescent radiation could be obtained in some embodiments.

Evanescent radiation penetrating the thin film 115 is scattered by the atoms and molecules of the thin film 115. The scattering may be elastic or inelastic in nature. In certain embodiments, a pattern in the thin film 115 acts as a resonant cavity resulting in absorption of the evanescent radiation. In certain embodiments, the thin film 115 includes fluorophores that are excited by the evanescent radiation penetrating the thin film 115. Moreover, because evanescent waves are non-propagating and are present at distances that are substantially smaller than wavelength of the light, evanescent waves contain high spatial frequency information which yields optical resolution below the Abbe limit. Thus, detecting and analyzing the evanescent radiation scattered by the thin film 115 can provide information about geometry of the thin film 115 as well as physical and chemical properties of the thin film 115.

For example, in cases where the thin film 115 is a patterned thin film, direct optical imaging of the evanescent radiation scattered by the thin film 115 provides information relating to the geometry of the pattern even if the pattern has features substantially smaller than the wavelength of the radiation R (e.g., a pattern have a critical dimension or a pitch in a range from about 50 nm to about 100 nm). In such instances, elastically scattered evanescent radiation contains information about the pattern and its geometry. As discussed elsewhere herein, certain patterns form resonant cavities for the evanescent radiation and result in substantial or total absorption of evanescent radiation. Such patterns also give rise to a characteristic optical image from the scattered evanescent radiation.

Referring back to FIG. 1, an evanescent radiation detector 130 detects the evanescent waves scattered by the thin film 115. In an embodiment, the evanescent radiation detector 130 includes a high-numerical aperture (NA) lens 135. The high-NA lens 135 includes a Weierstrass-like lens having the shape of a truncated sphere with a thickness equal to $(1+1/n)$ times its radius, in an embodiment. In other embodiments, the high-NA lens 135 includes a hemispherical solid immersion lens (SIL). In such embodiments, the SIL is placed adjacent to the optical element 120 such that light from the optical element 120 is coupled into the high-NA lens 135. The SIL is formed from high refractive index materials such as, for example, diamond, strontium titanate, fused quartz, fluorine doped fused quartz, etc. in various embodiments, depending on the wavelength of the radiation R. In certain embodiments the high-NA lens 135 further includes an aspheric lens to compensate or correct for aberrations.

In some embodiments, the high-NA lens 135 includes a liquid immersion lens where a suitable liquid is placed between an objective lens and the optical element 120. Examples of liquids used as the immersion liquid include water, cedar oil, glycerin, paraffin oil, synthetic oil, anisole, bromonaphthalene, methylene iodide, etc. A suitable liquid is chosen depending on the wavelength of the radiation R, in particular, the absorption characteristics of the liquid for a chosen the radiation R.

The distance between the surface of the optical element 120 not in contact with the thin film 115 and the surface of the high-NA lens 135 depends on the material of the high-NA lens 135 as well as the material between the optical element 120 and the high-NA lens 135 (e.g., in case of a liquid immersion lens). In various embodiments, the distance between the surface of the optical element 120 and the surface of the high-NA lens 135 is in a range from about 0 to about 150 µm.

Once the scattered evanescent radiation is collected by the high-NA lens 135, the collected radiation is directed to various analyzers such as, for example, a Raman spectrometer 170, a fluorescence detector (i.e., a camera or a photodiode) or a photoimaging apparatus 175 (i.e., a camera or a photodiode). In an embodiment, the evanescent radiation detector 130 further includes one or more dichroic mirrors 160 to distribute and direct light to various detectors and analyzers. In some embodiments, additional optical elements such as polarizers (not shown in the figures) are included in the optical path from the optical element 120 to respective detectors and analyzers.

As discussed elsewhere herein, the pattern within the thin film 115 may provide resonant cavities for the evanescent the radiation R, resulting in a characteristic absorption spectrum that is dependent on the pattern. Likewise, the atoms and molecules of the thin film 115 may elastically and/or inelastically scatter the evanescent radiation. The elastically scattered (i.e., Rayleigh scattered) evanescent radiation provides a characteristic spectrum based on the crystal structure of material of the thin film 115 and as well as defects present in the thin film 115. The inelastically scattered evanescent radiation either provides a characteristic Raman spectrum based on rotational states of the material of the thin film 115 or a characteristic fluorescence spectrum depending on the presence of fluorophores in the thin film 115. Thus, by analyzing the various spectra, geometric, physical and chemical properties of the thin film 115 can be determined.

Figure 3A:
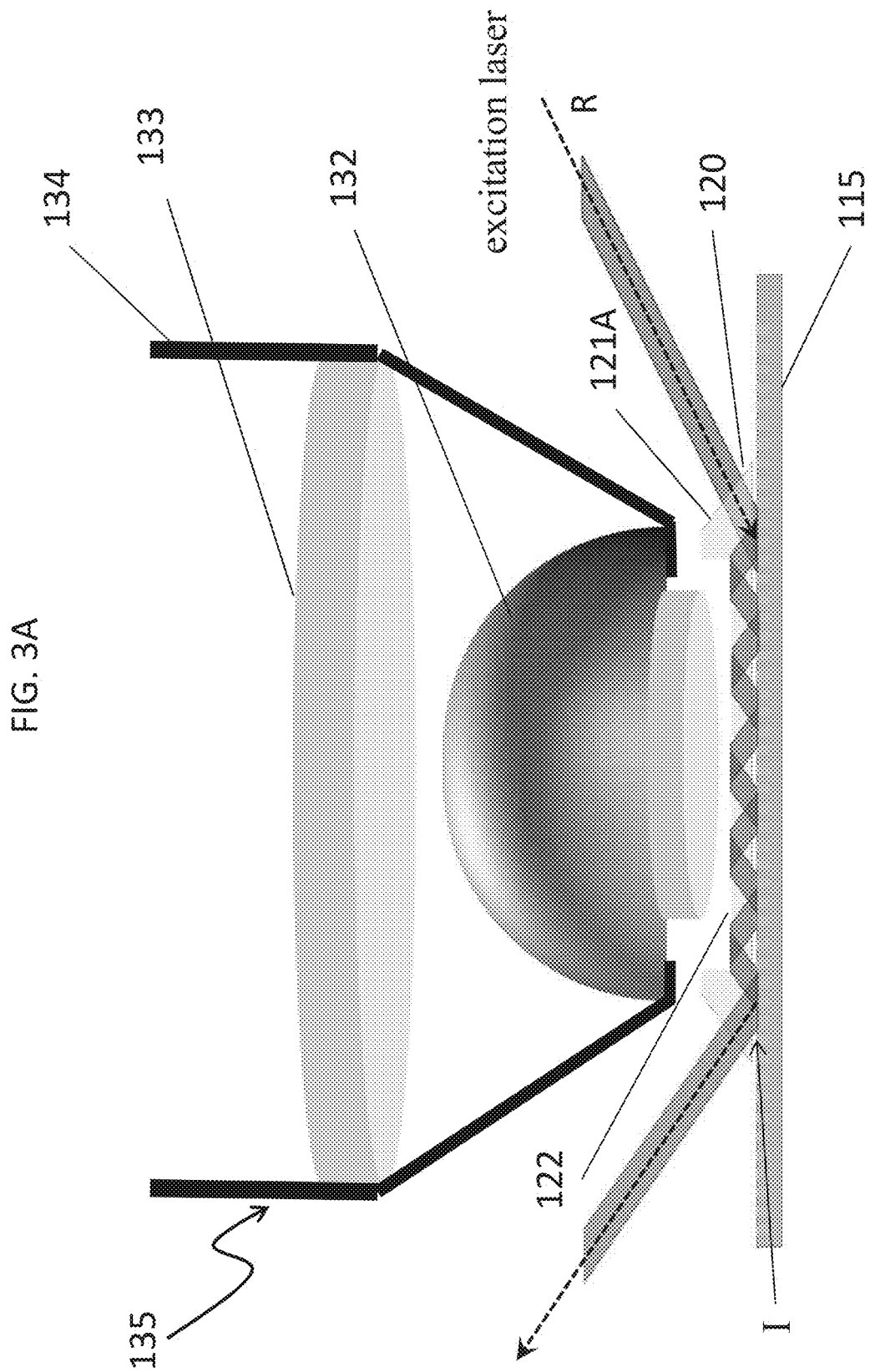
FIG. 3A schematically depicts an apparatus for metrology analysis of a thin film, in accordance with an embodiment of the present disclosure.
Figure 3B:
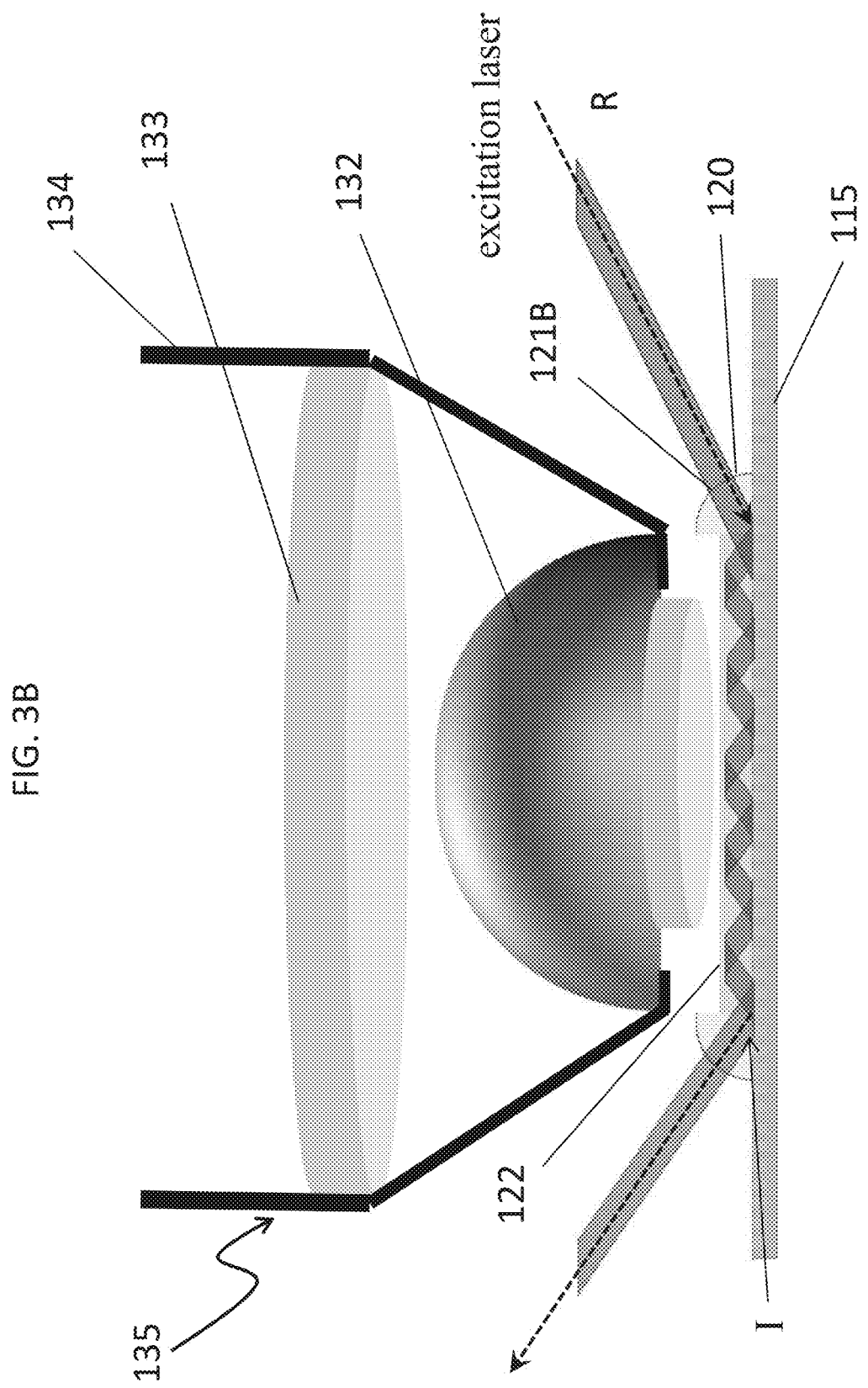
FIG. 3B schematically depicts an apparatus for metrology analysis of a thin film, in accordance with another embodiment of the present disclosure.

FIGS. 3A-3C schematically depict apparatuses for metrology analysis of a thin film in accordance with various embodiments of the present disclosure. In various embodiments, the high-NA lens 135 includes a hemispherical SIL 132, one or more correction lenses 133 for compensating or correcting aberrations, and a lens housing 134.

In certain embodiments, correction lenses 133 include one or more selected from the group consisting of a meniscus lens, doublet lenses, triplet lenses, adjustable lenses, etc. In embodiments where, for example, fluorescence measurements are to be performed, correction lenses 133 further include low-pass, high-pass, or band-pass filters to selectively block certain wavelengths or noise.

The lens housing 134 holds the various lenses of the high-NA lens 135. The lens housing 134 is made of materials such as, for example, steel or ceramic in various embodiments. In cases where the thin film 115 is to be imaged in a vacuum (i.e., the optical element 120 and the high-NA lens 135 are in a vacuum chamber), the various lens components are fused with lens housing 135 made of a ceramic material in some embodiments. Such fusion eliminates the need for adhesives which may degas in a vacuum chamber and lose their effectiveness in securing the various lens components. Such housings, however, can be expensive and bulky. On the other hand, in cases where the thin film 115 is to be imaged in air, a relatively standard metallic (e.g., steel) housing is used for securing the various lens components. The various lens components may be secured to a metallic housing using commercially available adhesives.

In an embodiment, as depicted in FIG. 3A, the optical element 120 includes angled side surfaces 121A. Without wishing to be bound by theory, such angled side surfaces 121A facilitate the coupling of the radiation R into the optical element 120 and increase the possible angles at which the radiation R could be coupled into the optical element 120 when compared to side surfaces that are perpendicular to the thin film 115. In an embodiment, the angle of the side surface is chosen such that the radiation R, incident perpendicular to side surface the 121A, is incident at an angle greater than the critical angle at the interface I. In such embodiments, minor changes to the angle of incidence at the side surface 121A are used to vary the skin depth d.

In some embodiments, the optical element 120 includes a recess at a top surface 122 to accommodate the high-NA lens 135. In an embodiment, the high-NA lens 135 is glued or fused to the optical element 120 so as to minimize a gap between the top surface 122 of the optical element 120 and a bottom surface of the high-NA lens 135.

In an embodiment, as depicted in FIG. 3B, the optical element 120 includes rounded side surfaces 121B. Such rounded side surfaces 121B facilitate control of the angle of incidence at interface I between the optical element 120 and the thin film 115. The rounded side surface 121B results in the radiation R being incident at the interface I along a radial direction of the rounded side surface 121B, the point of incidence being a center of the sphere of which the rounded portion forms a part. In other words, the radiation R is perpendicular to the side surface 121B irrespective of the angle the radiation R makes with interface I. This results in more precise control of the angle of incidence at the interface I based on the angle directed by the input angle scanning mirror 145. As discussed elsewhere herein, in some embodiments, the optical element 120 includes a recess at the top surface 122, while the side surface 121B is rounded, to accommodate the high-NA lens 135.

In embodiments depicted in FIGS. 3A-3B, the size and shape of the optical element 120 is not particularly limited. For example, the optical element 120 is a circular disc having a diameter in the range from about 1 mm to about 20 mm, and a thickness in the range from about 0.1 mm to about 2 mm, in some embodiments. In such embodiments, geometric, physical and/or chemical characteristics of the thin film 115 can be obtained over a large area without moving the optical element 120 with respect to the thin film 115. The reduction in complexity of coupling the radiation R into the optical element 120, in such embodiments, would be apparent to the skilled artisan.

In an embodiment, depicted in FIG. 3C, the optical element 120 forms a part of the high-NA lens 135. In such construction, the optical element 120 itself is designed to be an SIL, and functions as the SIL 132C of the high-NA lens 135. In such embodiments, because the optical element 120 is a hemispherical SIL, the effect on coupling of the radiation R into the optical element 120 is similar to that of the optical element 120 with rounded side surfaces discussed with reference to FIG. 3B. In other words, because of the hemispherical geometry of the optical element 120 in such embodiments, the radiation R is coupled radially into the optical element 120, and the point of incidence at the interface I is the same as the center of the hemisphere. This results in availability of a significantly wider range of possible incidence angles θ, and facilitates a more precise control of the skin depth d.

In various embodiments, the optical element 120/132C is manufactured from a material with a high refractive index (higher than that of the thin film 115) and low absorption for the chosen wavelengths (e.g., DUV or EUV) of the radiation R. For example, in some embodiments, the optical element 120/132C is made of diamond, sapphire, strontium titanate, etc.

In addition, because condenser lens 132C (same as the optical element 120) and the high-NA lens 135, in such embodiments, is in contact with the thin film 115, evanescent radiation scattered by the thin film 115 is more effectively coupled into the high-NA lens 135 because it is possible in such embodiments to achieve an NA of greater than 1. Further, because the optical element 120 is the same as condenser lens 132C of the high-NA lens 135, losses during coupling of the evanescent radiation between the optical element 120 and the high-NA lens 135, as well as any losses within the optical element 120, which occur in embodiments depicted in FIGS. 3A-3B, are eliminated. Moreover, material and manufacturing costs are also reduced by eliminating some components or using them as dual-function components.

On the other hand, because the optical element 120 functions as the SIL for the high-NA lens 135 in these embodiments, the size of the optical element is limited to the size of the SIL. In other words, the area of the interface I, in such embodiments, is limited by the size of the SIL that can be effectively manufactured. In various embodiments, the SIL 132C/120 has a diameter in the range of about 0.5 mm to about 2 mm. Thus, in such embodiments, the optical element 120/132C needs to be scanned over the thin film 115 to obtain geometric, physical and chemical characteristics of the thin film 115. The relative motion between the optical element 120/132C and the thin film 115 can be achieved either by moving the entire optical assembly including one or more of the high-NA lens 135, the input focus lens 140, the input angle scanning mirror 145 and the radiation source S, or by moving the thin film 115 using the wafer control stage 110.

A skilled artisan will note that the lens housing 134 for the high-NA lens 135, in such embodiments, will have to be suitably modified to enable the radiation R to couple into the optical element 120/132C.

Figure 3D:
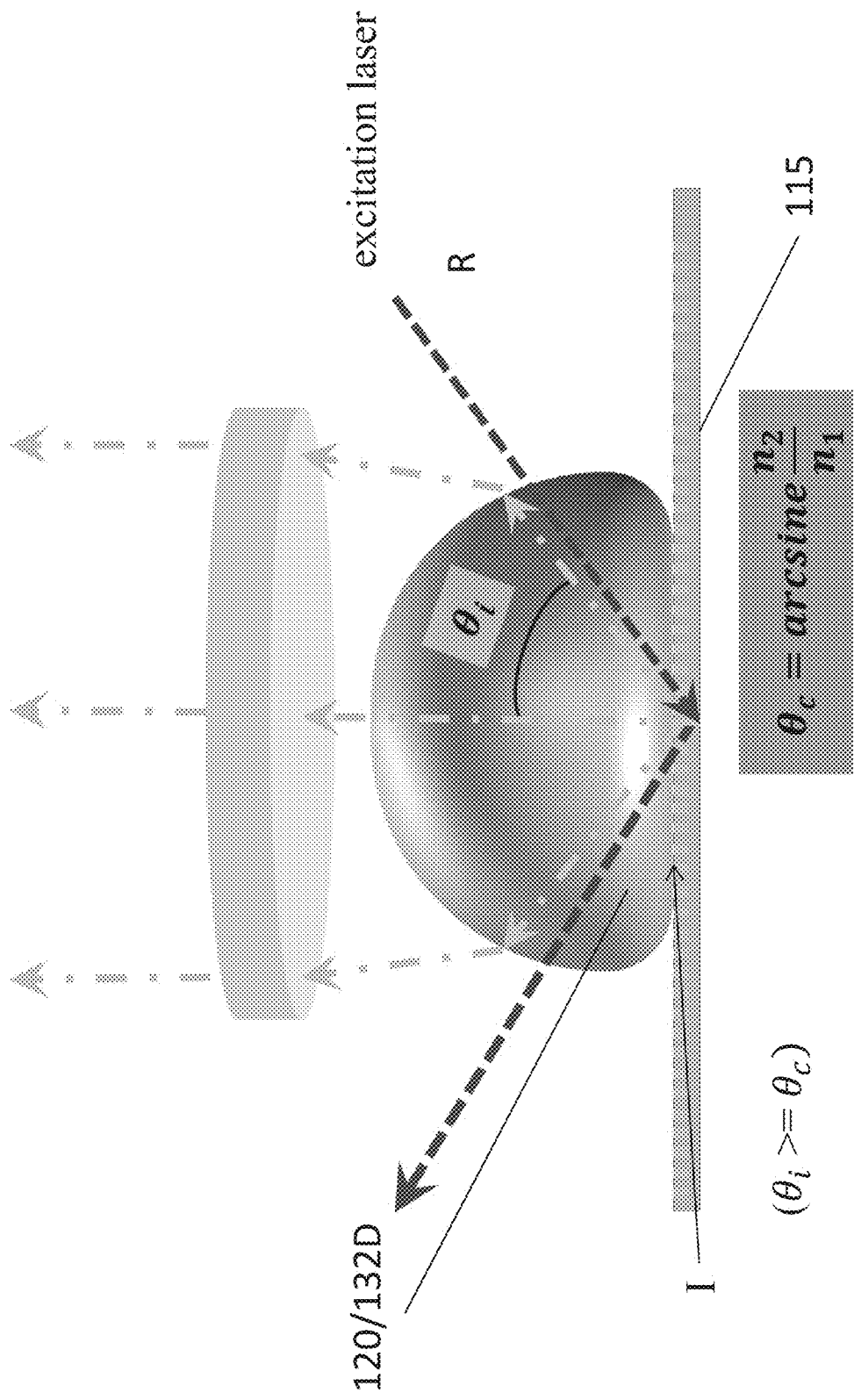
FIG. 3D schematically depicts an apparatus for metrology analysis of a thin film, in accordance with still another embodiment of the present disclosure.

In an embodiment, depicted in FIG. 3D, the optical element 120 forms a part of the high-NA lens 135 in the same way as depicted in FIG. 3C. However, in the embodiment depicted in FIG. 3D, the condenser lens 132D of the high-NA lens 135 is an achromatic SIL (Weierstrass-like lens) having a shape of a truncated sphere as described elsewhere herein. An achromatic SIL has a total height that is greater than the radius of the sphere. Such a condenser lens 132D provides a higher NA than a hemispherical SIL depicted in FIG. 3C. Without wishing to be bound by theory, a Weiesterass-like condenser lens is capable of providing NA as large as the relative refractive index (i.e., refractive index of material of the condenser refractive index of material of the thin film). Thus, by manufacturing an achromatic SIL using a high refractive material like diamond, NA higher than 1 is achievable in certain embodiments.

As in the case of the hemispherical SIL depicted in FIG. 3C, evanescent radiation scattered by the thin film 115 is more effectively coupled into the high-NA lens 135 with condenser 132D. Further, any losses during coupling of evanescent radiation between the optical element 120 and the high-NA lens 135, as well as any losses within the optical element 120, which occur in embodiments depicted in FIG. 3A-3B, are eliminated. Moreover, material and manufacturing costs are also reduced in some embodiments.

On the other hand, the size of the optical element is limited to the size of the achromatic SIL 132D, thereby limiting the area of the interface I, in such embodiments. In various embodiments, the achromatic SIL 132D/120 has a diameter in the range of about 0.5 mm to about 2 mm.

Figure 4:
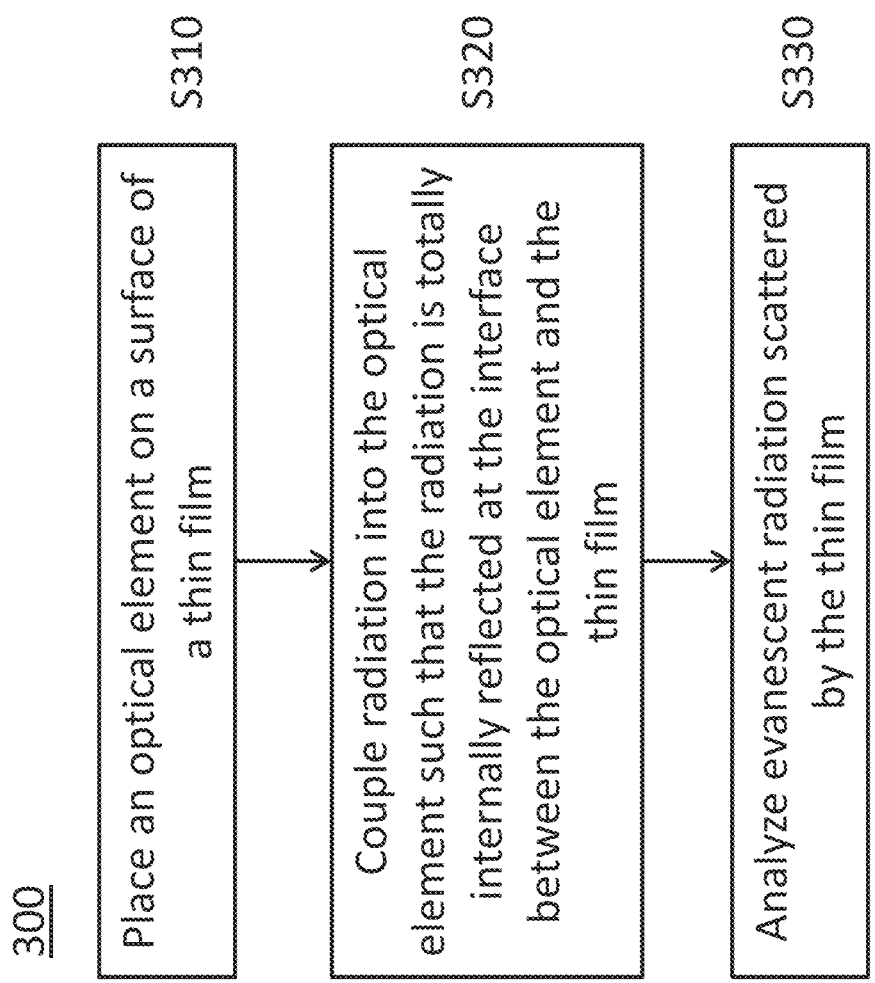
FIG. 4 depicts a flow chart of a method 300 of obtaining properties of a thin film disposed on a solid substrate, in accordance with an embodiment of the present disclosure.

FIG. 4 depicts a flow chart of a method 300 of obtaining properties of a thin film disposed on a solid substrate, in accordance with an embodiment of the present disclosure. In an embodiment, method 300 includes, at S310 placing an optical element having a higher refractive index than the thin film over the thin film, and at S320, coupling a radiation from a radiation source into the optical element such that the radiation is totally internally reflected at an interface between the optical element and the thin film and an evanescent radiation generated at the interface penetrates the thin film.

The radiation source, in some embodiments, is a continuous laser with an average power in the range from about 100 µW to about 1 W. In other embodiments, the radiation source is a pulsed laser with a pulse frequency in the range from about 10 Hz to about 100 MHz and a peak power in the range of about 100 µW to about 1 W. In various embodiments, the wavelength of the radiation source ranges from about 150 nm to about 300 nm.

In various embodiments, the optical element is made of a material with high refractive index and low absorption in a chosen region of the electromagnetic spectrum such as, for example, DUV or EUV. The material of the optical element includes, but is not limited to, diamond, sapphire, strontium titanate, etc. The shape and size of the optical element is not particularly limited. For example, the optical element is a circular disc having a diameter of ranging from about 0.5 mm to about 5 mm and a thickness ranging from about 100 µm to about 2 mm in some embodiments. In other embodiments, the optical element is a hemisphere having a diameter ranging from about 0.2 mm to about 2 mm. In yet other embodiments, the optical element is a truncated sphere with a height larger than the diameter of the sphere, having a diameter in the range from about 0.2 mm to about 2 mm.

Method 300 further includes, at S330, analyzing the evanescent radiation scattered by the thin film to obtain properties of the thin film. In various embodiments, analysis of the evanescent radiation scattered by the thin film includes optical imaging, fluorescence imaging, fluorescence spectroscopy, Raman spectroscopy and time-resolved Raman spectroscopy. The analysis of the evanescent radiation, in certain embodiments, provides information about, for example, the geometry of the thin film or of a pattern on the thin film (based on optical imaging of the evanescent radiation), chemical composition of the thin film (based on Raman spectroscopy or time-resolved Raman spectroscopy of the evanescent radiation, as well as from fluorescence imaging and spectroscopy), presence, size and density of impurities or defects in the thin film (based on fluorescence imaging ad spectroscopy and Raman or time-resolved Raman spectroscopy).

FIG. 5 depicts a flow chart of a method 400 of performing metrology analysis of a thin film, in accordance with an embodiment of the present disclosure. In an embodiment, method 400 includes, at S410, coupling a radiation into an optical element disposed adjacent to a surface of the thin film such that the radiation is totally internally reflected at an interface between the optical element and the thin film and an evanescent radiation generated at the interface penetrates the thin film, and at S420, analyzing the evanescent radiation scattered by the thin film to obtain properties of the thin film.

In various embodiments, wavelength of the radiation R ranges from about 150 nm to about 300 nm. The radiation, in some embodiments, is from a continuous laser with an average power in the range from about 100 µW to about 1 W. In other embodiments, the radiation is from a pulsed laser with a pulse frequency in the range from about 10 Hz to about 100 MHz and a peak power in the range of about 100 µW to about 1 W.

In various embodiments, the optical element is made of a material with high refractive index and low absorption in a chosen region of the electromagnetic spectrum such as, for example, DUV or EUV. The material of the optical element includes, but is not limited to, diamond, sapphire, strontium titanate, etc. The shape and size of the optical element is not particularly limited. For example, the optical element is a circular disc having a diameter of ranging from about 0.5 mm to about 5 mm and a thickness ranging from about 100 µm to about 2 mm in some embodiments. In other embodiments, the optical element is a hemisphere having a diameter ranging from about 0.2 mm to about 2 mm. In yet other embodiments, the optical element is a truncated sphere with a height larger than the diameter of the sphere, having a diameter in the range from about 0.2 mm to about 2 mm.

In various embodiments, analysis of the evanescent radiation scattered by the thin film includes optical imaging, fluorescence imaging, fluorescence spectroscopy, Raman spectroscopy and time-resolved Raman spectroscopy.

It will be understood that not all advantages have been necessarily discussed herein, no particular advantage is required for all embodiments or examples, and other embodiments or examples may offer different advantages.

According to one aspect of the present disclosure, an apparatus for metrology analysis of a thin film (TF) includes an optical element disposed adjacent to a surface the TF. The optical element is configured to totally internally reflect a radiation from a radiation source at an interface between the optical element and the TF. Evanescent radiation is generated at the interface and penetrates the TF. The apparatus further includes an evanescent radiation detector configured to detect the evanescent radiation scattered by the TF. In one or more of the foregoing and following embodiments, the optical element includes at least one selected from the group consisting of a diamond prism, a liquid immersion lens, a centric solid immersion lens (cSIL) and an achromatic solid immersion lens (aSIL). In an embodiment, the detector is further configured to perform at least one selected from the group consisting of optical imaging, Raman spectroscopy, time-resolved Raman spectroscopy and fluorescence imaging to obtain properties of the TF. In an embodiment, the optical element includes a radiation coupler disposed adjacent to the surface of the TF and a high numerical aperture (NA) lens. The radiation coupler is configured to couple radiation from the radiation source S such that the radiation is totally internally reflected at the interface between the radiation coupler and the patterned thin film. The high-NA lens is configured to couple the evanescent radiation to the evanescent radiation detector. In one or more of the foregoing and following embodiments, the apparatus further includes an input angle controller configured to change an angle of coupling of radiation from the radiation source into the optical element. In an embodiment, the radiation source includes a continuous or a pulsed laser having a wavelength in a range from about 150 nm to about 300 nm. In an embodiment, the laser has an average power in a range from about 100 µW to about 100 mW. In an embodiment, the TF includes a film having a thickness in the range from about 1 nm to about 100 nm disposed on a solid substrate. In one or more of the foregoing and following embodiments, the apparatus further includes a scanner configured to enable relative motion between the optical element and the TF. In an embodiment, the optical element has a diameter in the range from about 50 µm to about 5 mm.

According to another aspect of the present disclosure, a method of performing metrology analysis of a thin film includes coupling a radiation into an optical element disposed adjacent to a surface of the TF such that the radiation is totally internally reflected at an interface between the optical element and the TF and an evanescent radiation generated at the interface penetrates the TF, and analyzing the evanescent radiation scattered by the TF to obtain properties of the TF. In one or more of the foregoing and following embodiments, analyzing the evanescent radiation includes at least one selected from the group consisting of optical imaging, Raman spectroscopy, time-resolved Raman spectroscopy and fluorescence imaging. In an embodiment, the thin film includes a film having a thickness in the range from about 1 nm to about 100 nm disposed on a solid substrate. In an embodiment, the radiation has a wavelength in the range from about 150 nm to about 300 nm. In one or more of the foregoing and following embodiments, the method further includes changing an angle of coupling of the radiation into the optical element to change a depth of penetration of the evanescent radiation into the thin film.

According to yet another aspect of the present disclosure, a method of obtaining properties of a thin film disposed on a solid substrate includes placing an optical element having a higher refractive index than the TF over the TF, coupling a radiation from a radiation source into the optical element such that the radiation is totally internally reflected at an interface between the optical element and the TF and an evanescent radiation generated at the interface penetrates the TF, detecting the evanescent radiation scattered by the TF, and analyzing the detected evanescent radiation scattered by the TF to obtain properties of the TF. In one or more of the foregoing and following embodiments, analyzing the detected evanescent radiation includes at least one selected from the group consisting of optical imaging, Raman spectroscopy, time-resolved Raman spectroscopy and fluorescence imaging. In an embodiment, properties of the TF obtained include at least one selected from the group consisting of a critical dimension of a pattern formed on the TF, a shape of the pattern formed on the TF, an impurity present in the TF, a chemical composition of the TF, a size of a defect present in the TF and a density of the defect present in the TF. In an embodiment, the optical element includes at least one selected from the group consisting of a diamond prism, a liquid immersion lens, a centric solid immersion lens (cSIL) and an achromatic solid immersion lens (aSIL). In an embodiment, the radiation source includes a continuous or a pulsed laser having a wavelength in a range from about 150 nm to about 300 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An imaging system for analyzing a thin film, the system comprising:
    an optical element disposed adjacent to a surface of the thin film and configured to totally internally reflect a radiation from a radiation source at an interface between the optical element and the thin film such that an evanescent radiation is generated at the interface penetrating the thin film, the optical element including a radiation coupler disposed adjacent to the surface of the thin film and a high numerical aperture (NA) lens;
    one or more dichroic mirrors to split the evanescent radiation into a first radiation in a first direction and a second radiation in a second direction;
    a first detector configured to analyze the first radiation in the first direction to obtain properties of the thin film;
    a second detector configured to optically observe the second radiation in the second direction to observe evanescent field Rayleigh scattering; and
    an imaging device with one or more correction lenses to correct aberrations.

2. The system of claim 1, wherein the one or more correction lenses comprises at least one selected from the group consisting of a meniscus lens, doublet lenses, triplet lenses, adjustable lenses.

3. The system of claim 1, wherein the one or more correction lenses include low-pass, high-pass, or band-pass filters to selectively block certain wavelengths or noise.

4. The system of claim 1, wherein:
    the optical element comprises a radiation coupler disposed adjacent to the surface of the thin film and the high numerical aperture (NA) lens,
    the radiation coupler is configured to couple radiation from the radiation source such that the radiation is totally internally reflected at the interface between the radiation coupler and the thin film, and
    the high numerical aperture (NA) lens is configured to couple the evanescent radiation to the second detector.

5. The system of claim 1, further comprising an input angle controller configured to change an angle of coupling of radiation from the radiation source into the optical element.

6. The system of claim 1, wherein the radiation source comprises a continuous or a pulsed laser having a wavelength in a range from about 150 nm to about 300 nm.

7. The system of claim 6, wherein the laser has an average power in a range from about 100 µW to about 100 mW.

8. The system of claim 1, wherein the thin film comprises a film having a thickness in the range from about 1 nm to about 100 nm disposed on a solid substrate.

9. The system of claim 1, further comprising a scanner configured to enable relative motion between the optical element and the thin film.

10. The system of claim 1, wherein the optical element comprises at least one selected from the group consisting of a liquid immersion lens, a centric solid immersion lens (cSIL) and an achromatic solid immersion lens (aSIL).

11. An imaging tool for an analysis of a thin film, the tool comprising:
    an imaging device coupling a radiation into an optical element disposed adjacent to a surface of the thin film such that the radiation is totally internally reflected at an interface between the optical element and the thin film and an evanescent radiation generated at the interface penetrates the thin film, the optical element including a radiation coupler disposed adjacent to the surface of the thin film and a high numerical aperture (NA) lens; and
    one or more dichroic mirrors configured to split the evanescent radiation scattered by the thin film using into a first radiation in a first direction and a second radiation in a second direction,
    wherein the imaging device is configured to provide a structural image within the thin film based on the first radiation by a first detector; and an optical image based on the second radiation by a second detector to observe evanescent field Rayleigh scattering.

12. The imaging tool of claim 11, wherein the first radiation comprises at least one selected from the group consisting of optical imaging, Raman spectroscopy, time-resolved Raman spectroscopy and fluorescence imaging.

13. The imaging tool of claim 11, wherein the thin film comprises a film having a thickness in the range from about 1 nm to about 100 nm disposed on a solid substrate.

14. The imaging tool of claim 11, wherein the radiation has a wavelength in the range from about 150 nm to about 300 nm.

15. The imaging tool of claim 11, further comprising changing an angle of coupling of the radiation into the optical element to change a depth of penetration of the evanescent radiation into the thin film.

16. A method of obtaining properties of a thin film disposed on a solid substrate, the thin film having a front surface, the method comprising:
    placing an optical element having a higher refractive index than the thin film over the thin film at a front surface side of the thin film, the optical element including a radiation coupler disposed adjacent to the surface of the thin film and a high numerical aperture (NA) lens;
    placing a radiation source in the front surface side of the thin film;
    coupling a radiation from the radiation source into the optical element such that the radiation is totally internally reflected at an interface between the optical element and the thin film and an evanescent radiation generated at the interface penetrates the thin film;
    adjusting, by an input angle controller, an angle of coupling of radiation from the radiation source into the optical element;
    splitting the evanescent radiation scattered by the thin film using one or more dichroic mirrors into a first radiation in a first direction and a second radiation in a second direction;
    detecting the evanescent radiation scattered by the thin film by a first detector and collected by an immersion lens disposed on the front surface side of the thin film, wherein the radiation and the evanescent radiation scattered by the thin film are in the same side; and
    analyzing the detected evanescent radiation scattered by the thin film by a second detector to obtain properties of the thin film.

17. The method of claim 16, wherein the analyzing the detected evanescent radiation comprises at least one selected from the group consisting of optical imaging, Raman spectroscopy, time-resolved Raman spectroscopy and fluorescence imaging.

18. The method of claim 17, wherein properties of the thin film obtained comprise at least one selected from the group consisting of a critical dimension of a pattern formed on the thin film, a shape of the pattern formed on the thin film, an impurity present in the thin film, a chemical composition of the thin film, a size of a defect present in the thin film and a density of the defect present in the thin film.

19. The method of claim 17, wherein the optical element comprises at least one selected from the group consisting of a diamond prism, a liquid immersion lens, a centric solid immersion lens (cSIL) and an achromatic solid immersion lens (aSIL).

20. The method of claim 17, wherein the radiation source comprises a continuous or a pulsed laser having a wavelength in a range from about 150 nm to about 300 nm.

* * * * *